United States Patent [19]

Nakamura

[11] Patent Number: 5,453,954

[45] Date of Patent: Sep. 26, 1995

[54] SEMICONDUCTOR INTEGRATED CIRCUIT DEVICE WITH BUILT-IN REGULATING SYSTEM FOR DETERMINING MARGINS OF MAIN CIRCUITS

[75] Inventor: Kazuyuki Nakamura, Tokyo, Japan

[73] Assignee: NEC Corporation, Tokyo, Japan

[21] Appl. No.: 270,834

[22] Filed: Jul. 5, 1994

[30] Foreign Application Priority Data

Jul. 2, 1993 [JP] Japan ..................... 5-163719

[51] Int. Cl.$^6$ .................................................. G11C 7/00
[52] U.S. Cl. ............................................ 365/201; 365/203
[58] Field of Search .............................. 365/201, 203, 365/189.07, 189.11; 371/21.1, 21.4, 21.2

[56] References Cited

U.S. PATENT DOCUMENTS 4,970,727  11/1990  Miyawaki .................. 371/21.4
5,142,495  8/1992  Canepa .................... 365/201

OTHER PUBLICATIONS

A. Tanabe et al., "A 30-ns 64-Mb DRAM with Built-in Self-Test and Self-Repair Function", *IEEE Journal of Solid-State Circuits*, vol. 27, No. 11, Nov. 1992, pp. 1525–1533.

*Primary Examiner*—Joseph A. Popek
*Assistant Examiner*—A. Zarabian
*Attorney, Agent, or Firm*—Sughrue, Mion, Zinn, Macpeak & Seas

[57] ABSTRACT

A regulating system incorporated in a static type random access memory device store control data codes indicative of margins between actual circuit characteristics of a charging circuit and a sense amplifier and standard circuit characteristics thereof in a rewritable manner, and the control data codes are given to the regulating system through a testing operation before delivery from a factory for enhancing the device characteristics and the production yield.

9 Claims, 7 Drawing Sheets

SEMICONDUCTOR INTEGRATED CIRCUIT DEVICE WITH BUILT-IN REGULATING SYSTEM FOR DETERMINING MARGINS OF MAIN CIRCUITS

FIELD OF THE INVENTION

This invention relates to a semiconductor integrated circuit device and, more particularly, to a semiconductor integrated circuit device equipped with a built-in regulating circuit for determining a margin of a stable operation.

DESCRIPTION OF THE RELATED ART

While designing a semiconductor integrated circuit device, a designer takes fluctuations of process parameters in the fabrication process for an integrated circuit into account, and determines margins of a stability. For example, a static type random access memory cell produces a potential difference on the associated bit lines, and a smaller potential difference speeds up the data access. Although the potential difference to be required ranges from 10 mill-volt to 30 mill-volt, the designer usually gives the margin of the order of 50 mill-volt to a complementary MOS (Metal-Oxide-Semiconductor) transistor and about 20 mill-volt to a bipolar transistor. The margins enhance the productivity against the fluctuation in the process. However, the margins degrade the performance of the semiconductor integrated circuit device.

Figure 1:
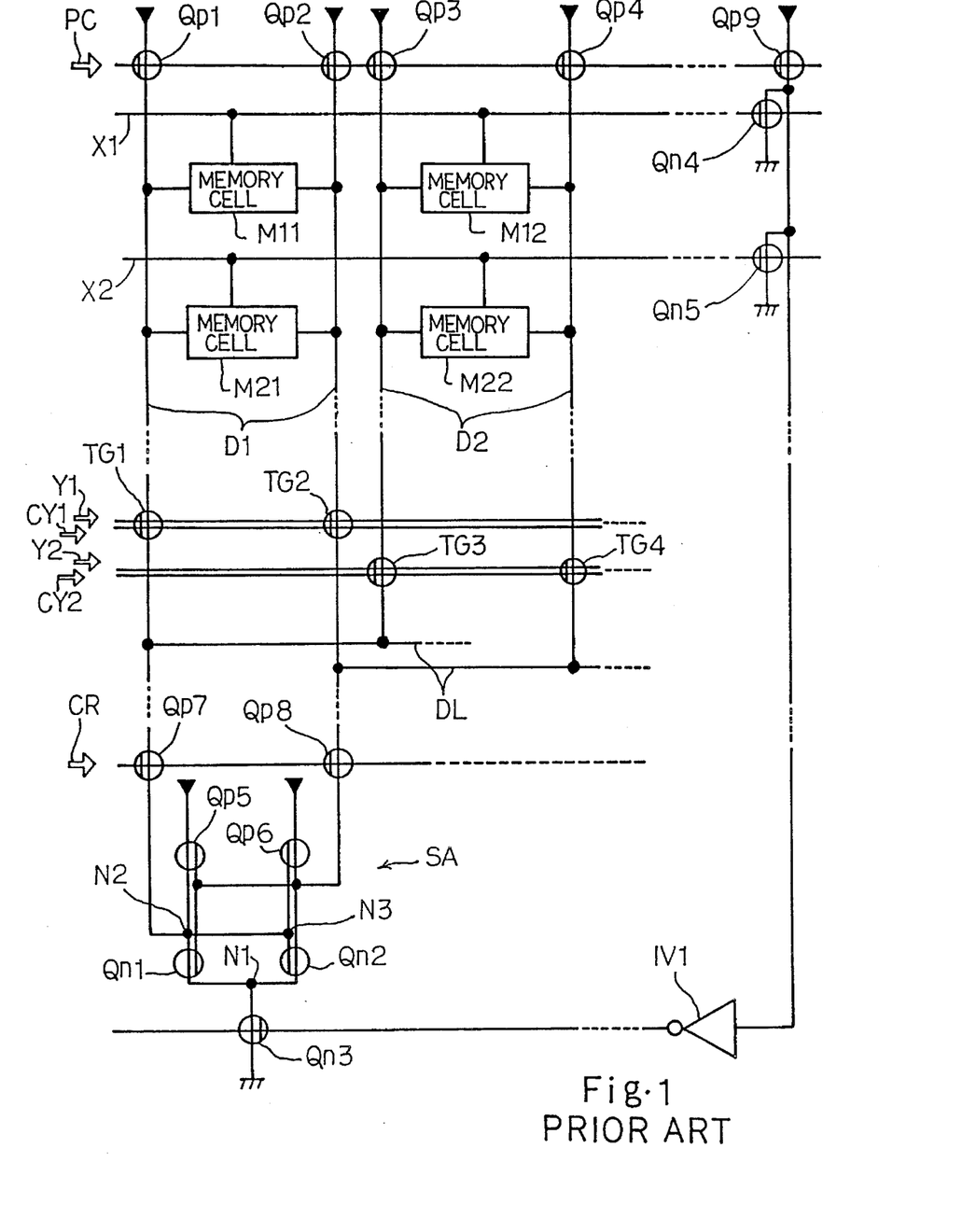
FIG. 1 is a circuit diagram showing the arrangement of the prior art static type random access memory device.

FIG. 1 shows a typical example of a static type random access memory device disclosed in Japanese Patent Publication of Unexamined Application No. 62-24495. The prior art static type random access memory device comprises a plurality of memory cells M11, M12, M21 and M22 arranged in matrix, a plurality of word lines X1 and X2 for selecting a row of memory cells M11/M12 or M21/M22 and a plurality of digit line pairs D1 and D2 respectively coupled with the columns of memory cells M11/M21 and M12/M22, and selectively enters into a write-in phase and a read-out phase. A data bit is stored in each of the memory cells M11 to M22 in the form of potential difference, and the digit line pairs D1 and D2 propagate the potential differences from and to the selected row of memory cells, respectively.

The prior art static type random access memory device further comprises a plurality of p-channel enhancement type charging transistors Qp1, Qp2, Qp3 and Qp4 coupled between a source of charge voltage and the digit lines D1/D2, and the p-channel enhancement type charging transistors Qp1 to Qp4 are responsive to a charging signal PC of active low voltage level. A read-out sequence or a write-in sequence starts with the charging signal PC of the active low voltage level, and the charging cancels the potential differences produced in the previous read-out or write-in sequence.

The prior art static type random access memory device further comprises a data line pair DL for propagating a potential difference indicative of an accessed data bit or a write-in data bit and a plurality of transfer gates TG1, TG2, TG3 and TG4 coupled between the digit lines D1/D2 and the data line pair DL. Each of the transfer gates TG1 to TG4 is implemented by a parallel combination of an n-channel enhancement type transfer transistor and a p-channel enhancement type transfer transistor, and column address decoded signals Y1 and Y2 and the complementary signals CY1 and CY2 selectively turn on and off the transfer gates TG1 to TG4 for coupling one of the digit line pairs D1/D2 with the data line pair DL.

The prior art static type random access memory device further comprises a sense amplifier SA for developing a potential difference indicative of an accessed data bit, and the sense amplifier SA comprises two series combinations of p-channel enhancement type field effect transistors Qp5/Qp6 and n-channel enhancement type field effect transistors Qn1/Qn2 coupled between a power voltage line and a common node N1 and an n-channel enhancement type switching transistor Qn3 coupled between the common node N1 and a ground voltage line. The n-channel enhancement type switching transistor Qn3 turns on in the read-out phase for activating the sense amplifier SA. However, the n-channel enhancement type switching transistor Qn3 is turned off in the write-in phase, and the sense amplifier SA is isolated from the ground voltage line.

The prior art static type random access memory device further comprises a pair of p-channel enhancement type transfer transistors Qp7 and Qp8 coupled between the data line pair DL and the drain nodes N2/N3 of the sense amplifier SA, and a read-out signal CR of the active low level allows the p-channel enhancement type transfer transistors Qp7 and Qp8 to turn on in the read-out phase. The read-out signal CR of inactive high voltage level keeps the p-channel enhancement type transfer transistors Qp7 and Qp8 off in the write-in phase.

The prior art static type random access memory device further comprises an inverter IV1 for controlling the n-channel enhancement type switching transistor Qn3, a p-channel enhancement type charging transistor Qp9 coupled between the power voltage line and the input node of the inverter IV1 and a plurality of n-channel enhancement type discharging transistors Qn4 and Qn5 coupled in parallel between the input node of the inverter IV1 and the ground voltage line. The n-channel enhancement type discharging transistors Qn4 and Qn5 are respectively gated by the word lines X1 and X2, and supplies the low voltage level to the input node of the inverter IV1. The charging signal PC is supplied to the gate electrode of the p-channel enhancement type charging transistor Qp9, and the positive power voltage level is supplied to the input node of the inverter IV1 while the digit line pairs D1 and D2 are being charged.

The prior art static type random access memory device behaves as follows. The memory cell M11 is assumed to be accessed in the read-out phase. The charging signal PC goes down to the active low voltage level, and the digit line pairs D1 and D2 are charged and equalized. The word line X1 is energized so as to select the row of memory cells M11/M12, and the other word line X2 is maintained at the low voltage level. The word line X1 causes the memory cells M11 and M12 to produce potential differences indicative of the data bits stored therein on the respective data line pairs D1 and D2. The column address decoded signal Y1 and the complementary signal CY1 cause the transfer gates TG1 and TG2 to turn on, and the digit line pair D1 is coupled through the transfer gates TG1 and TG2 with the data line pair DL. Then, the potential difference indicative of the accessed data bit passes through the transfer gates TG1 and TG2.

In the read-out phase, the read-out signal CR is maintained in the active low voltage level, and the p-channel enhancement type transfer transistors Qp7 and Qp8 are turned on. As a result, the potential difference indicative of the accessed data bit reaches the common drain nodes N2 and N3 of the sense amplifier SA.

The word line X1 is further operative to discharge the input node of the inverter IV1 through the n-channel enhancement type discharging transistor Qn4 to the ground voltage line. Then, the inverter IV1 supplies the active high voltage level to the gate electrode of the n-channel enhancement type switching transistor Qn3, and the sense amplifier SA is enabled for developing the potential difference indicative of the accessed data bit. The data line pair DL propagates the developed potential difference to an output buffer circuit (not shown).

In the write-in phase, the p-channel enhancement type transfer transistors Qp7 and Qp8 are turned off, and a potential difference indicative of a write-in data bit is transferred through the transfer gates TG1/TG2 and the digit line pair D1 to the memory cell M11.

In the read-out sequence, the selected word line starts not only the associated row of memory cells to produce the potential differences on the-digit line pairs D1 and D2 but also the inverter IV1 to activate the sense amplifier SA. The potential differences are developed with time, and the developing speed is dependent on the current driving capability of the component transistors of the memory cells M11 to M22.

On the other hand, the time interval between the selection of the word line and the activation of the sense amplifier SA is dominated by the n-channel enhancement type discharging transistors Qn4/Qn5 and the component transistors of the inverter IV1. Namely, if the n-channel enhancement type discharging transistor Qn4/Qn5 is, by way of example, large in current driving capability, the time interval is short, and the activation of the sense amplifier SA is closer to the selection of the word line.

The current driving capability is variable together with the transistor size and the doping level of the related impurity regions, and a fluctuation in the fabrication process affects the transistor size and the doping level. If the sense amplifier SA is activated before a sensible potential difference between the common drain nodes N2 and N3, the potential difference is liable to be undesirably inverted, and the error data bit is read out from the static type random access memory device.

In order to prevent the sense amplifier SA from the malfunction, the n-channel enhancement type discharging transistors Qn4 and Qn5 are designed to be smaller than theoretically appropriate size, and time delay or a time margin is introduced between the selection of the word line and the activation of the sense amplifier SA. This means that the products are intentionally degraded, and the miniaturization of component transistors requires a larger margin.

The margins are not inherent in the static type random access memory device, but is common to the semiconductor integrated circuit devices. The first problem inherent in the prior art semiconductor integrated circuit device is the intentional deterioration.

In a commercial production in a factory, a lot of products pass inspections as excellent products. However, parts of the excellent products may exceed the standard performance requested by a customer. Moreover, even if the inspections rejects other parts of the products, the rejection may be caused by the large margin, and the high performance component transistors may rescue parts of the rejected products if the margin becomes small. Thus, another problem inherent in the prior art semiconductor integrated circuit device is the unadaptable margin.

SUMMARY OF THE INVENTION

It is therefore an important object of the present invention to provide a semiconductor integrated circuit device which is free from the problems inherent in the prior art semiconductor integrated circuit device.

To accomplish the object, the present invention proposes to change circuit characteristics with control data information internally stored in a rewritable manner.

In accordance with the present invention, there is provided a semiconductor integrated circuit device selectively entering into a testing and regulating mode and a standard mode, comprising: a) a plurality of main circuits operative to sequentially carry out respective operations in the standard mode for achieving a given task, and given respective margins between actual performances and standard performances; and b) a regulating system enabled in the testing and regulating mode, and operative to store pieces of control data information indicative of the margins in a rewritable manner for regulating the margins to respective optimum values.

BRIEF DESCRIPTION OF THE DRAWINGS

The feature and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 2:
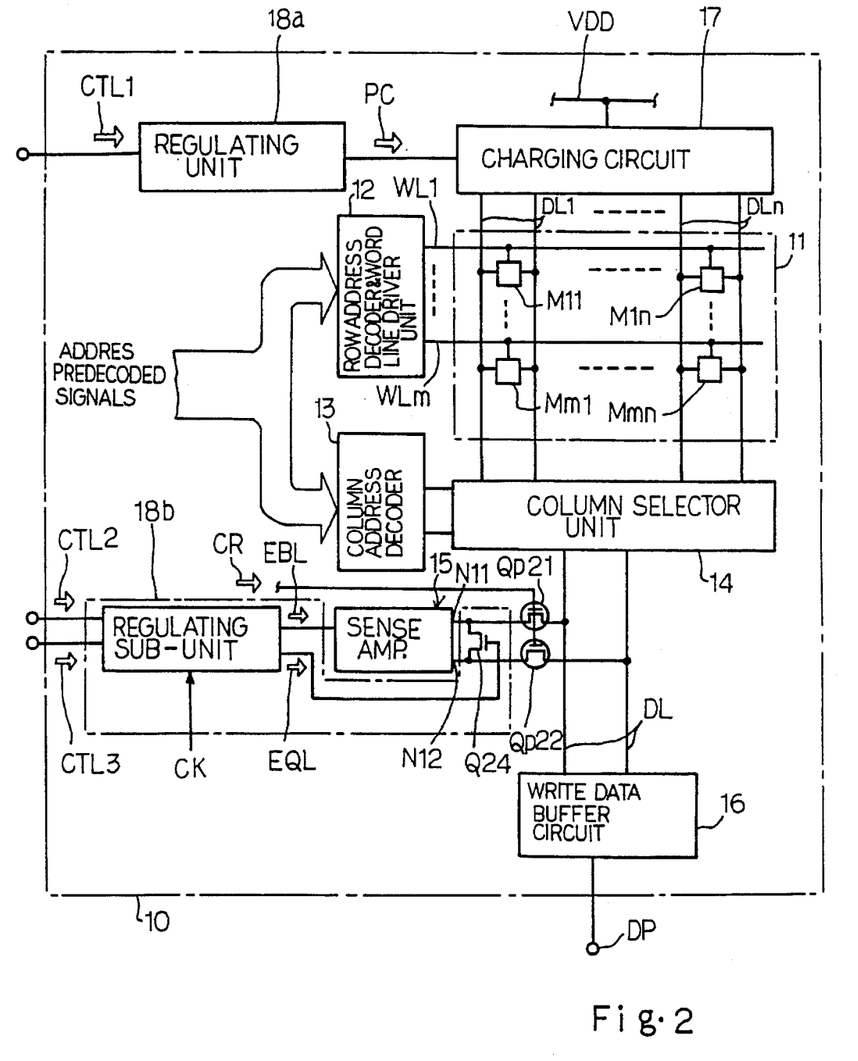
FIG. 2 is a block diagram showing the arrangement of a static type random access memory device according to the present invention.

Referring to FIG. 2 of the drawings, a static type random access memory device embodying the present invention is fabricated on a single semiconductor chip 10, and selectively enters into a test/regulating mode and a standard mode of operation. In the testing/regulating mode, the component circuits are examined, and appropriate margins are regulated to appropriate values. On the other hand, while the static type random access memory device is in the standard mode, a write-in sequence and a read-out sequence are selectively carried out depending upon an external control signal, and the static type random access memory device serves as a data storage.

The static type random access memory device comprises a memory cell array 11, and a plurality of memory cells M11, ... M1n, ..., Mm1 ... and Mmn form the memory cell array 11. The memory cells M11 to Mmn are arranged in rows and columns, and row addresses and column addresses are respectively assigned to the rows of memory cells and the columns of memory cells. Though not shown in the drawings, each of the memory cells M11 to Mmn may have a flip-flop circuit accompanied with a pair of n-channel enhancement type switching transistors.

The static type random access memory device further comprises an addressing system broken down into a row addressing sub-system and a column addressing sub-system. The row addressing sub-system selects one of the rows of memory cells M11 to Mmn, and the column addressing sub-system selects a memory cell from the selected row.

The row addressing sub-system comprises a plurality of word lines WL1 to WLm and a row address decoder/word line driver unit 12 responsive to row address predecoded signals for energizing one of the word lines WL1 to WLm. The word lines WL1 to WLm are respectively associated with the rows of memory cells M11 to Mmn, and each of the word lines WL1 to WLm is coupled with the gate electrodes of the n-channel enhancement type switching transistors of the associated row of memory cells. For this reason, the energized word line causes the n-channel enhancement type switching transistors of the associated row to turn on, and the status of each flip-flops becomes changeable.

The column addressing sub-system comprises a plurality of digit line pairs DL1 to DLn respectively associated with the columns of memory cells M11 to Mmn, a column address decoder unit 13 for decoding the column address predecoded signals and a column selector unit 14 for coupling one of the digit line pairs DL1 to DLn with a data line pair DL under the control of the column address decoder unit 13. The plurality of digit line pairs DL1 to DLn propagate potential differences between a selected row of memory cells and the column selector unit 14, and the column selector unit 14 transfers a potential difference indicative of one of the read-out data bits or a write-in data bit between a selected digit line pair and the data line pair DL.

The static type random access memory device further comprises a sense amplifier 15 for developing the potential difference dV indicative of the read-out data bit, a pair of p-channel enhancement type transfer transistors Qp21 and Qp22 coupled between the input nodes N11 and N12 of the sense amplifier 15 and the data line pair DL and an write data buffer circuit 16 coupled between the data line pair DL and an input/output data pin DP. The pair of p-channel enhancement type transfer transistors Qp21 and Qp22 is responsive to a read-out control signal CR of active low voltage level, and an internal control circuit (not shown) shifts the read-out control signal CR to the active low voltage level in the read-out sequence. However, the internal control circuit keeps the read-out control signal CR at inactive high voltage level in the write-in sequence. For this reason, the sense amplifier 15 develops the potential difference dV indicative of the read-out data bit only. Though not shown in the drawings, the sense amplifier 15 is similar in circuit arrangement to the sense amplifier SA shown in FIG. 1, and is activated with an enable signal EBL supplied to an n-channel enhancement type switching transistor corresponding to the transistor Qn3.

The static type random access memory device further comprises a charging circuit 17 coupled between a power voltage line VDD and the digit line pairs DL1 to DLn, and the charging circuit 17 is implemented by a plurality of p-channel enhancement type charging transistors Qp23 (see FIG. 3) arranged in parallel, and the p-channel enhancement type charging transistors Qp23 are gated with a charge control signal PC variable in active voltage level. Namely, if the charge control signal PC is lowered, the p-channel enhancement type charging transistors Qp23 produce respective conductive channels between the power voltage line VDD and the associated digit lines, and the charging circuit 17 supplies current Ic to the selected memory cells as will be described in detail hereinlater.

The current driving capability of each p-channel enhancement type charging transistor Qp23 is dependent on the channel size, the channel doping level and the potential level of the charge control signal PC. The channel size and the channel doping level are affected by fluctuation of a fabrication process, and, accordingly, the current driving capability is not constant. For this reason, the active level of the charge control signal PC is variable for regulating the current driving capability of the p-channel enhancement type charging transistors Qp23.

The static type random access memory device further comprises a first regulating unit 18a for changing the active level of the charge control signal PC and, accordingly, the current driving capability of the p-channel enhancement type charging transistors Qp23, and a second regulating unit 18b for regulating the sense amplifier 15.

The magnitude of the potential difference indicative of the read-out data bit is dependent on the amount of current Ic, and, accordingly, the current driving capability of the p-channel enhancement type charging transistor Qp23. An external control data code CTL1 is supplied to the first regulating unit 18a, and is indicative of the active level for the charge control signal PC. If the p-channel enhancement type charging transistor Qp23 is larger in current driving capability than the flip-flop of the memory cell, the potential difference is slowly developed on the digit line pair, and the first regulating unit 18a has to regulate the active level of the charge control signal PC to a higher level for decreasing the current driving capability of the p-channel enhancement type charging transistor Qp23. Thus, the first regulating unit 18a accelerates or decelerates the development of the potential difference indicative of the read-out data bit.

The second regulating unit 18b produces the enable signal EBL for activating the sense amplifier 15 and an equalizing signal EQL for equalizing the data lines of the pair DL. The second regulating unit 18b stores a second control data code CTL2 indicative of the timing for activating the sense amplifier 15 and a third control data code CTL3 indicative of the timing for equalizing the data lines, and supplies the enable signal EBL and the equalizing signal EQL at the timings respectively specified by the second and third control data codes CTL2 and CTL3.

Figure 3:
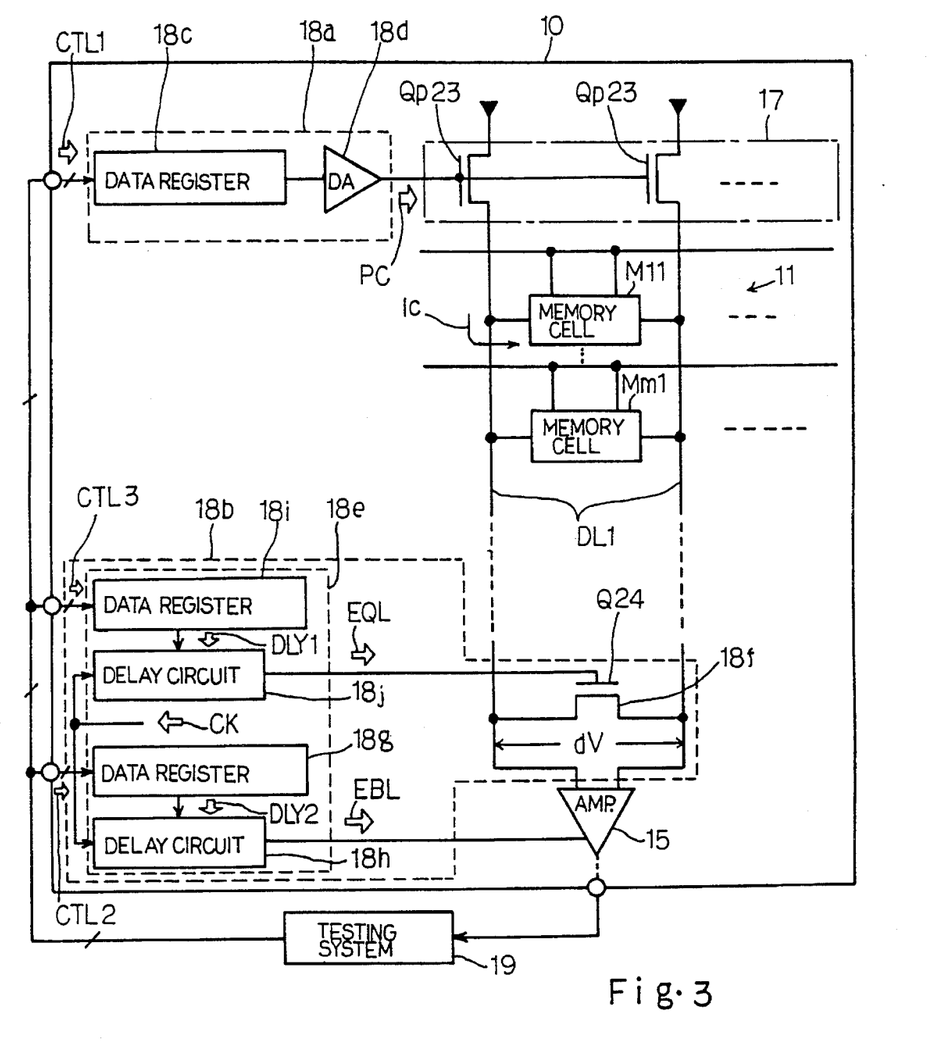
FIG. 3 is a schematic view showing essential parts of the static type random access memory device shown in FIG. 2.

Turning to FIG. 3 of the drawings, the first and second regulating units 18a and 18b are illustrated in detail. The other array 11 and circuits 15 and 17 are simplified or omitted to facilitate the description of the device. The first regulating unit 18a comprises a data register 18c for storing the first control data code CTL1 and a digital-to-analog converter 18d for producing the charge control signal PC. The first control data code CTL1 is indicative of the active low voltage level of the charge control signal PC, and, accordingly, the digital-to-analog converter 18d changes the active low voltage level of the charge control signal PC depending upon the first control data code CTL1.

The second regulating unit 18b largely comprises a regulating sub-unit 18e for producing the enable signal EBL and the equalizing signal EQL from the second control data code CTL2 and the third control data code CTL3 and an enhancement type equalizing transistor Q24 responsive to the equalizing signal EQL for equalizing the data lines.

The regulating sub-unit 18e comprises a data register 18g for storing the second control data code CTL2 for producing a first delay control signal DLY1, a delay circuit 18h responsive to the first delay control signal DLY1 for introducing first time delay with respect to the clock signal CK, a data register 18i for storing the third control data code CTL3 for producing a second delay control signal DLY2 and a delay circuit 18j responsive to the second delay control signal DLY2 for introducing second time delay with respect to the clock signal CK. The delay circuit 18h produces the enable signal EBL upon the expiration of the first time delay and supplies the enable signal EBL to the sense amplifier 15 so as to start the sense amplifier 15 to develop the potential difference dV on the data line pair DL.

On the other hand, the delay circuit 18j produces the equalizing signal EQL upon the expiration of the second time delay, and supplies the equalizing signal EQL to the equalizing transistor Q24 for canceling the potential difference dV.

The testing system 19 produces the first, second and third control data codes CTL1, CTL2 and CTL3, and increments and decrements the values of these control data codes CTL1 to CTL3. Upon completion of the fabrication sequence, the static type random access memory device is subjected to inspections before delivery from the factory, and the testing system 19 is coupled with the static type random access memory device for the testing/regulating mode.

In this instance and the charging circuit 17, the sense amplifier 15 form parts of a plurality of main circuits, and the regulating units 18a and 18b as a whole constitute a regulating system.

Figure 4A:
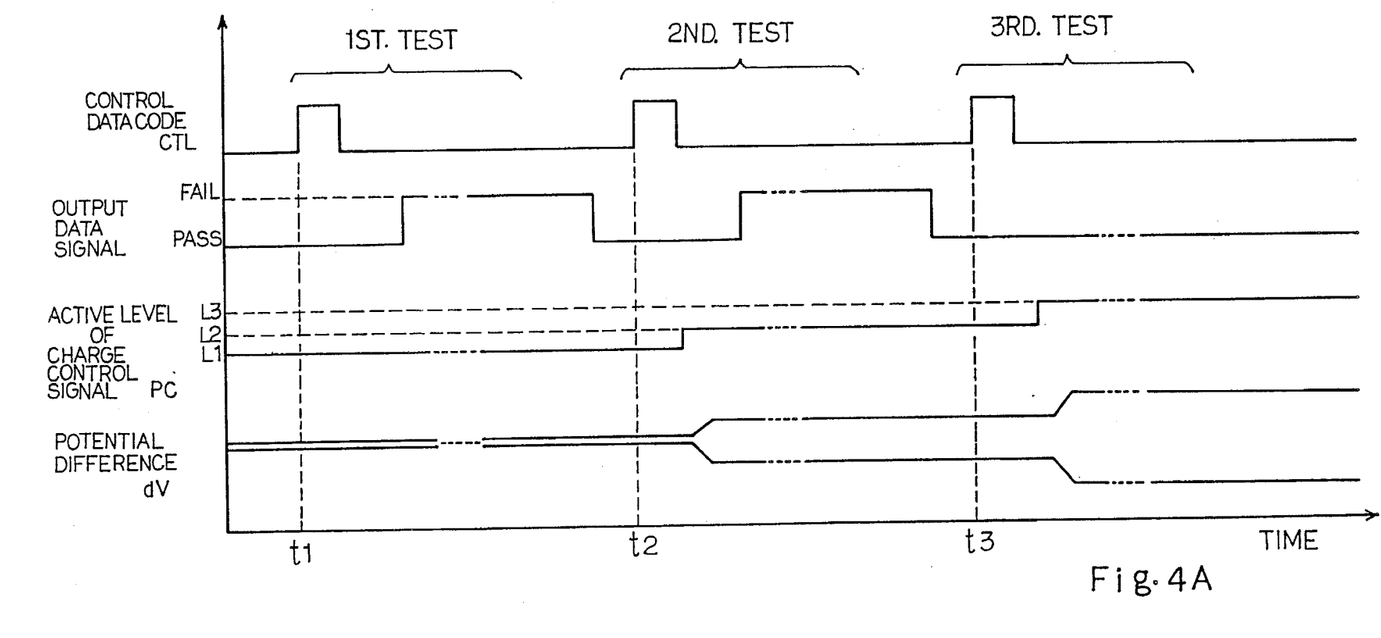
FIGS. 4A and 4B are timing charts showing testing/regulating sequences carried out for the static type random access memory device.

In the testing/regulating mode, the testing system 19 is coupled with the static type random access memory device, and the testing system 19 supplies the first control data code CTL1 indicative of the active low voltage level L1 much lower than the inactive high voltage level at time t1. The read-out sequence is carried out for one of the memory cells M11 to Mmn storing the data bit corresponding to the output data signal of low voltage level. In the read-out sequence, the regulating unit 18a shifts the charge control signal PC to the active low voltage level much lower than the inactive high voltage level, and the p-channel enhancement type charging transistors Qp23 a large amount of current more than the current Ic flowing into the selected memory cell. As a result, only negligible amount of potential difference dV takes place on the data line pair DL, and the output data signal is changed to the high voltage level representative of fail.

Subsequently, the testing system 19 supplies the first control data code CTL1 indicative of the active level L2 higher than the active level L1 to the data register 18c at time t2, and the read-out sequence is repeated. The digital-to-analog converter 18d shifts the charge control signal PC to the active low level L2, and decreases the current driving capability of the charging circuit 17. Although the potential difference dV is larger than that of the previous read-out sequence, the potential difference dV does not reach the sensible level of the sense amplifier 15, and the output data signal is shifted to the high voltage level indicative of the fail.

The testing system 19 supplies the control data code CTL1 indicative of the active level L3 much higher than the active level L1 at time t3, and the read-out sequence is repeated. The digital-to-analog converter 18d shifts the charge control signal PC to the active level L3, and degrades the current driving capability of the charging circuit 17. As a result, the current passing through the charging circuit 17 is balanced with the current Ic, and the potential difference exceeds the sensible level of the sense amplifier 15. The output data signal remains in the low level, and teaches that the margin for the charging circuit 17 is optimized.

Figure 4B:
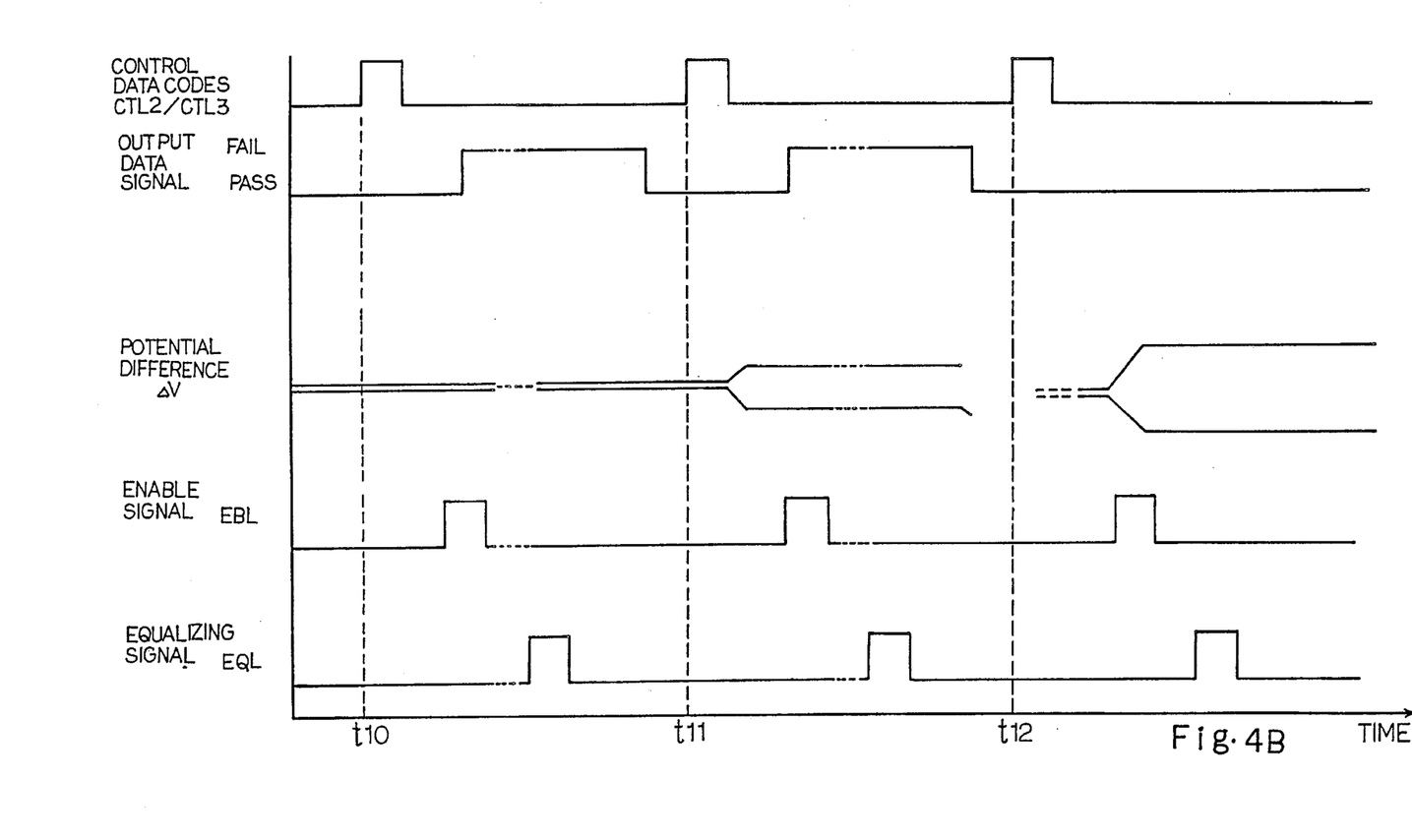

FIG. 4B illustrates the regulating sequence for the sense amplifier 15 in the testing/regulating mode. The testing system 19 supplies the second and third control data codes CTL2 and CTL3 to the data registers 18g and 18i, respectively, at time t10, and allows the static type random access memory device to start the read-out sequence. The second and third control data codes CTL2 and CTL3 are indicative of short time delays, and delay circuits 18h and 18j supplies the enable signal EBL and the equalizing signal EQL to the sense amplifier 15 and the equalizing transistor Q24 before the potential difference dV reaches the sensible level. As a result, the output data signal is changed to the high voltage level indicative of a failure.

The testing system 19 changes the second and third control data codes CTL2 and CTL3 at time t11, and the delay circuits 18h prolong the time delay for the enable signal EBL and the time delay for the equalizing signal EQL, respectively. The enable signal EBL is supplied to the sense amplifier 15 after the potential difference dV exceeds the sensible level. However, the time delay for the equalizing signal EQL is too short to complete the sense amplification. For this reason, the potential difference dV is not sufficiently developed, and the output signal is changed to the high voltage level again.

The testing system 19 further changes the second and third control data codes CTL2 and CTL3, and the second and third control data codes CTL2 and CTL3 are assumed to be appropriate for the time delays. The read-out sequence results in the sufficiently developed potential difference dV, and the output data signal is maintained in the low voltage level indicative of the optimized margins.

As will be appreciated from the foregoing description, the static type random access memory device according to the present invention optimizes the margins in the testing and regulating operation after the completion of the fabrication process. The optimized margins allow the static type random access memory device to accelerate the data access, and rescue some defective products.

Second Embodiment

Figure 5:
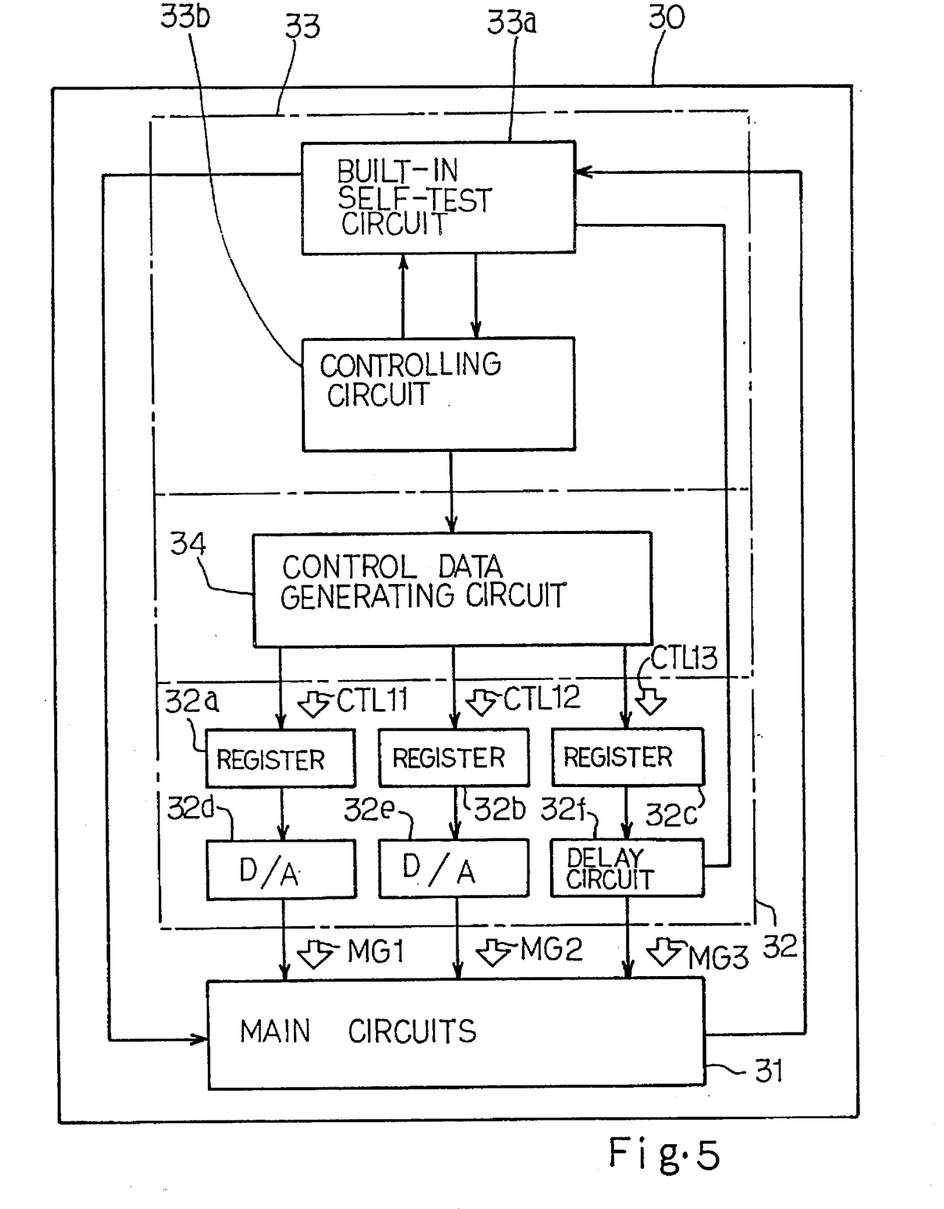
FIG. 5 is a block diagram showing a regulating system incorporated in another semiconductor integrated circuit device according to the present invention.

Turning to FIG. 5 of the drawings, another semiconductor integrated circuit device embodying the present invention is fabricated on a single semiconductor chip 30, and largely comprises a plurality of main circuits 31, a regulating system 32, a built-in testing system 33 for testing sequences on the main circuits 31 and a control data generating circuit 34 for changing control data codes on the basis of the results of the testing sequences.

In this instance, margin control signals MG1 and MG2 respectively control the characteristics of two of the main circuits 31, and a margin control signal MG3 controls a timing for another main circuit. For this reason, the regulating system 32 has three registers 32a, 32b and 32c for storing control data codes CTL11, CTL12 and CTL13 in a rewritable manner, two digital-to-analog converters 32d and 32e for producing the margin control signals MG1 and MG2 from the control data codes CTL11 and CTL12 and a delay circuit 32f for producing the margin control signal from the control data code.

The built-in testing system 33 comprises a built-in self-test circuit 33a operative to carry out the testing sequences on the main circuits 31 under the control of a controlling circuit 33b. The results of the testing sequences are reported to the control data generating circuit 34, and the control data generating circuit 34 changes the control data codes CTL11, CTL12 and CTL13. The built-in self-test circuit 33a is known to a person skilled in the art, and a paper entitled as "A 30 ns 64 Mb DRAM with Built-in Self-Test and Self-repair function" discloses a kind of built-in self-test circuit, by way of example.

Figure 6:
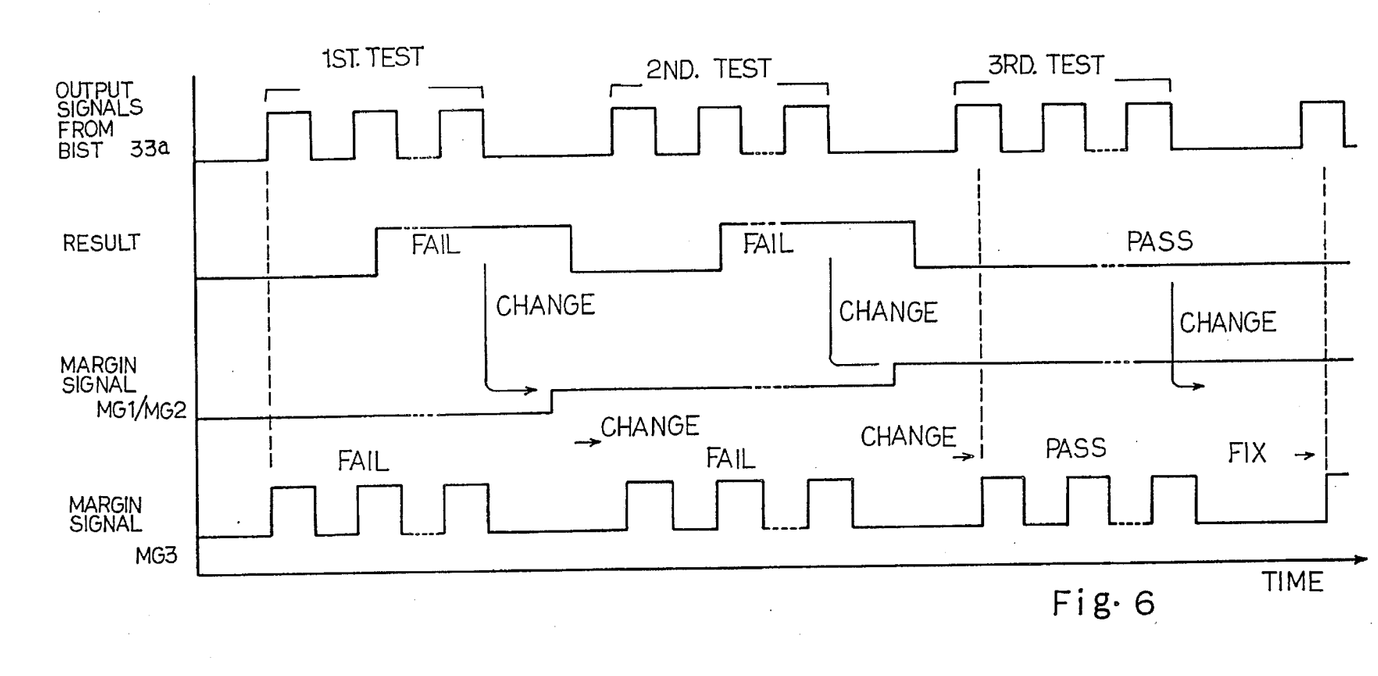
FIG. 6 is a timing chart showing the testing/regulating sequence carried out for the semiconductor integrated circuit device shown in FIG. 5.

Turning to FIG. 6 of the drawings, the testing/regulating sequence is illustrated. If the semiconductor integrated circuit device is a memory device, the output signals of the BIST (Built-In Self-Test) circuit 33a are address signals, an input data signal and controlling signals for write-in/read-out sequences. An output data signal indicative of the read-out data bit is indicative of the result of the testing sequence. The BIST circuit 33a diagnoses the main circuits 31 on the basis of the output data signal, and determines either fail or pass. The result, i.e., fail or pass is reported to the control data generating circuit 34, and the control data generating circuit 34 increases or decreases the margins depending upon the result. The testing/regulating sequences are repeated until the result indicates the pass, and the regulating system 32 cooperated with the built-in testing system 33 and the control data generating circuit 34 optimizes the semiconductor integrated circuit device.

Although particular embodiments of the present invention have been shown and described, it will be obvious to those skilled in the art that various changes and modifications may be made without departing from the spirit and scope of the present invention. For example, if a plurality of component circuits incorporated in a semiconductor integrated circuit device sequentially achieve respective tasks, the present invention is applicable to the semiconductor integrated circuit device, and the regulating units may regulate the timings, the voltage levels, the amount of current etc. Moreover, a floating gate type memory cell may be available for storing an analog value indicative of the control data.

What is claimed is:

1. A semiconductor integrated circuit device selectively entering into a testing and regulating mode and a standard mode, comprising:
    a) a plurality of main circuits capable of sequentially performing respective operations in said standard mode for achieving a given task, wherein said plurality of main circuits have actual circuit characteristics and wherein margins exist between said actual circuit characteristics and desired circuit characteristics due to variations in fabricating said plurality of main circuits; and
    b) a regulating system connected to said main circuits, wherein said regulating system is enabled in said testing and regulating mode and stores control data indicative of said margins in a rewritable manner and wherein said regulating system regulates said margins to respective optimum values so that said plurality of main circuits operate more similarly to circuits having said desired circuit characteristics.

2. The semiconductor integrated circuit device as set forth in claim 1, in which said semiconductor integrated circuit device serves as a static type random access memory device comprising:
    a charging circuit for supplying currents to digit lines coupled with memory cells; and
    a sense amplifier for developing a potential difference between two of said digit lines,
    said charging circuit and said sense amplifier being two of said plurality of main circuits,
    said regulating system comprising a first regulating unit for regulating a margin for a current driving capability of said charging circuit and a second regulating unit for regulating a margin for an activated time period of said sense amplifier.

3. The semiconductor integrated circuit device as set forth in claim 2, in which said first regulating unit comprises:
    a data register for storing a piece of control data indicative of said margin for said current driving capability; and
    a digital-to-analog converter which converts a digital value indicative of said piece of control data to a voltage level supplied to a plurality of charging transistors forming in combination said charging circuit.

4. The semiconductor integrated circuit device as set forth in claim 2, in which said second regulating unit comprises:
    a first data register for storing a first piece of control data indicative of a timing for producing an enable signal supplied to said sense amplifier,
    a first delay circuit responsive to said first piece of control data stored in said first data register for producing said enable signal,
    a second data register for storing a second piece of control data indicative of a timing for an equalizing signal,
    a second delay circuit responsive to said second piece of control data for producing said equalizing signal, and
    an equalizing transistor coupled between said two of said digit lines and responsive to said equalizing signal for equalizing said two of said digit lines.

5. The semiconductor integrated circuit device as set forth in claim 1, in which further comprises:
    a built-in testing system which controls testing sequences on said plurality of main circuits for determining said control data to be optimized, and
    a control data generating circuit which adjusts said control data if a result of said testing sequences indicates that said control data are not optimized.

6. A static type random access memory device selectively entering into a testing and regulating mode and a standard mode, comprising:
    memory cells respectively storing data bits;
    digit lines selectively connected to said memory cells;
    a charging circuit for supplying currents to said digit lines;
    a sense amplifier for developing potential differences between pairs of said digit lines;
    said charging circuit and said sense amplifier respectively having a current driving capability and a activated time period in said standard mode; and
    a regulating system enabled in said testing and regulating mode comprising:
        a first regulating unit for regulating a margin for said current driving capability of said charging circuit; and
        a second regulating unit for regulating a margin for said activated time period of said sense amplifier.

7. The static type random access memory device as set forth in claim 6, in which said first regulating unit comprises:
    a first data register for storing a first piece of control data indicative of said margin for said current driving capability; and
    a digital-to-analog converter which converts a digital value indicative of said first piece of control data to a voltage level supplied to a plurality of charging transistors forming in combination said charging circuit.

8. The static type random access memory device as set forth in claim 6, in which said second regulating unit comprises:
    a first data register for storing a first piece of control data indicative of a timing for producing an enable signal supplied to said sense amplifier, a first delay circuit responsive to said first piece of control data stored in said first data register for producing said enable signal, a second data register for storing a second piece of control data indicative of a timing for an equalizing signal, a second delay circuit responsive to said second piece of control data for producing said equalizing signal, and an equalizing transistor coupled between each of said pairs of said digit lines and responsive to said equalizing signal for equalizing each of said pairs of said digit lines.

9. The static type random access memory device as set forth in claim 7, in which said second regulating unit comprises:

a second data register for storing a second piece of control data indicative of a timing for producing an enable signal supplied to said sense amplifier, a first delay circuit responsive to said second piece of control data stored in said second data register for producing said enable signal, a third data register for storing a third piece of control data indicative of a timing for an equalizing signal, a second delay circuit responsive to said third piece of control data for producing said equalizing signal, and an equalizing transistor coupled between each of said pairs of said digit lines and responsive to said equalizing signal for equalizing each of said pairs of said digit lines.

* * * * *